US007079415B2

(12) United States Patent
Frey

(10) Patent No.: US 7,079,415 B2
(45) Date of Patent: Jul. 18, 2006

(54) MAGNETIC RANDOM ACCESS MEMORY ELEMENT

(75) Inventor: Christophe Frey, Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/881,747

(22) Filed: Jun. 30, 2004

(65) Prior Publication Data
US 2006/0002186 A1    Jan. 5, 2006

(51) Int. Cl.
G11C 11/15    (2006.01)
(52) U.S. Cl. .................. 365/173; 365/171; 365/185.05
(58) Field of Classification Search ............... 365/173, 365/158, 189.08, 189.05, 190, 185.05, 230.08, 365/171, 154, 185.09, 185.11, 189.01
See application file for complete search history.

(56) References Cited

U.S. PATENT DOCUMENTS

| 5,029,141 | A | 7/1991 | Yoshimoto et al. | |
|---|---|---|---|---|
| 5,274,597 | A | 12/1993 | Ohbayashi et al. | |
| 5,287,304 | A * | 2/1994 | Harward et al. | 365/189.01 |
| 6,335,890 | B1 | 1/2002 | Reohr et al. | |
| 6,532,163 | B1 | 3/2003 | Okazawa | |
| 6,594,191 | B1 | 7/2003 | Lammers et al. | |
| 6,597,601 | B1 * | 7/2003 | Ooishi | 365/171 |
| 6,639,834 | B1 * | 10/2003 | Sunaga et al. | 365/185.05 |
| 6,717,844 | B1 * | 4/2004 | Ohtani | 365/158 |
| 6,778,429 | B1 | 8/2004 | Lu et al. | |
| 6,778,434 | B1 | 8/2004 | Tsuji | |
| 6,795,335 | B1 | 9/2004 | Hidaka | |
| 6,829,162 | B1 | 12/2004 | Hosotani | |
| 6,862,235 | B1 | 3/2005 | Sakata et al. | |
| 6,891,742 | B1 | 5/2005 | Takano et al. | |
| 6,894,918 | B1 | 5/2005 | Sharma et al. | |
| 6,940,749 | B1 | 9/2005 | Tsang | |
| 2002/0064067 | A1 * | 5/2002 | Inui | 365/158 |
| 2002/0027803 | A1 | 6/2002 | Matsui | |
| 2002/0080644 | A1 * | 6/2002 | Ito | 365/158 |
| 2003/0026125 | A1 | 2/2003 | Hidaka | |

(Continued)

FOREIGN PATENT DOCUMENTS

EP    1 320 104    6/2003

OTHER PUBLICATIONS

Nahas, "A 4Mb 0.μm 1T1MTJ Toggle MRAM Memory," 2004 IEEE International Solid-State Circuits Conference, ISSCC 2004, Session 2, Non-Volatile Memory/2.3, 0-7803-8267-6, 2004.

(Continued)

Primary Examiner—Tuan T. Nguyen
Assistant Examiner—Dang Nguyen
(74) Attorney, Agent, or Firm—Lisa K. Jorgenson; Andre M. Szuwalski

(57) ABSTRACT

A magnetic random access memory element is made from a first magnetic tunnel junction and a second magnetic tunnel junction. A latching circuit includes a false node that is connected to the first magnetic tunnel junction and a true node that is connected to the second magnetic tunnel junction. A pair of complementary bit lines are provided in association with the element. A first access transistor interconnects a false one of the bit lines to the false node of the latching circuit, while a second access transistor interconnects a true one of the bit lines to the true node of the latching circuit. The memory element accordingly has an SRAM four transistor (4T) two load (2R) architecture wherein the resistances associated with the two magnetic tunnel junctions provide the two load resistances.

26 Claims, 1 Drawing Sheet

U.S. PATENT DOCUMENTS

| | | |
|---|---|---|
| 2003/0058686 A1 | 3/2003 | Ooishi et al. |
| 2004/0052105 A1* | 3/2004 | Fulkerson et al. .......... 365/158 |
| 2004/0125643 A1* | 7/2004 | Kang et al. ................. 365/148 |
| 2004/0208052 A1* | 10/2004 | Hidaka ....................... 365/158 |
| 2005/0180203 A1 | 8/2005 | Lin et al. |
| 2005/0281080 A1 | 12/2005 | Dray et al. |

OTHER PUBLICATIONS

Patent Abstracts of Japan, vol. 2000, No. 03, and JP 11 354728, Canon, Inc.

* cited by examiner

*FIG. 1*
*(PRIOR ART)*
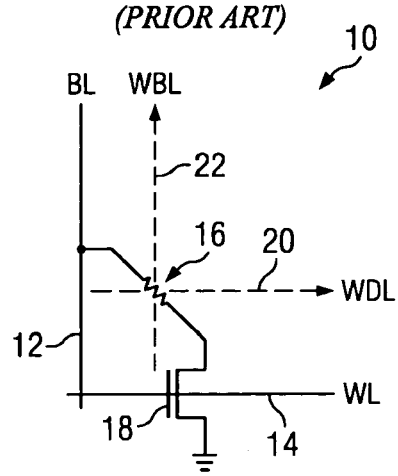
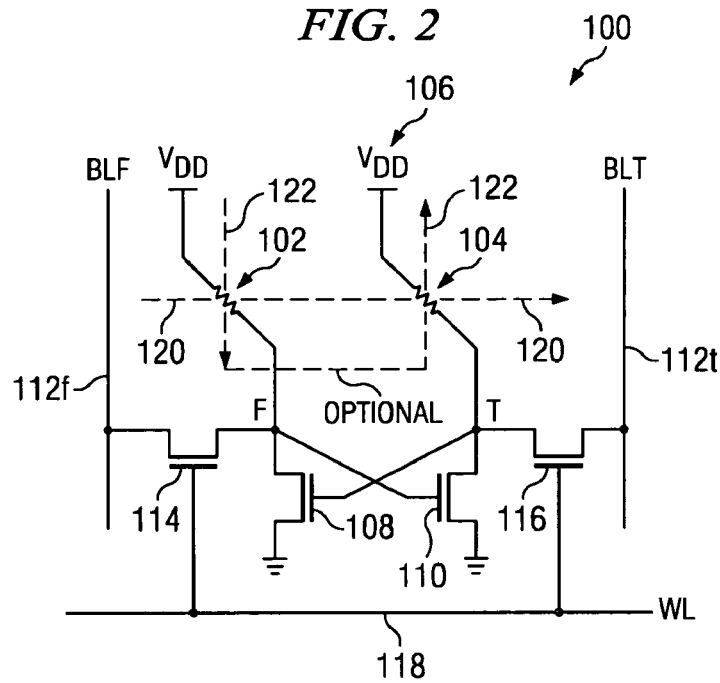
*FIG. 2*
*FIG. 3*
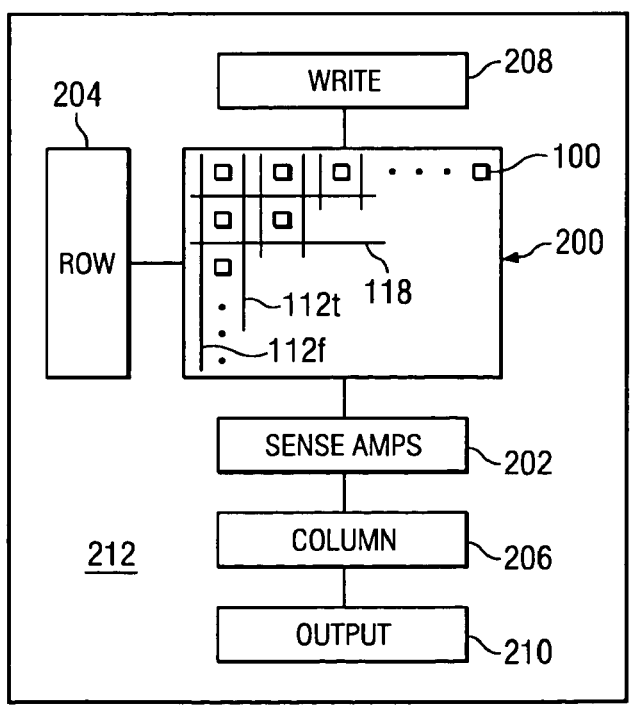

MAGNETIC RANDOM ACCESS MEMORY ELEMENT

BACKGROUND OF THE INVENTION

1. Technical Field of the Invention

The present invention relates to magnetic random access memories and more particularly to a magnetic random access memory element.

2. Description of Related Art

A magnetic random access memory (MRAM) element typically has a structure that includes a first and second magnetic layers which are separated by a non-magnetic layer. A magnetic vector in one of the two magnetic layers is magnetically fixed or pinned, while the magnetic vector of the other of the two magnetic layers is not fixed and thus its magnetization direction is free to be controlled and switch. Information is written to and read from the element as a logic "1" or a logic "0" by changing the direction of the non-fixed magnetization vector in the other of the two magnetic layers. The differences in magnetization vector direction cause resistance variations within the element which can be measured. For example, the shifting of the magnetization vector direction can represent two different resistances or potentials, which are then read by the memory circuit as either a logic "1" or a logic "0." The detection of these resistance or potential differences due to shifting magnetization vector direction allows information to be written to and read from the MRAM element.

Reference is now made to FIG. 1 wherein there is shown a schematic diagram of a conventional MRAM element 10. The element includes a bit line 12 and a word line 14. The memory storing structure of the element 10 is referred to as a "magnetic tunnel junction" 16 (MTJ) which is represented in the schematic by a variable resistance and is physically composed of the first and second magnetic layers and the separating non-magnetic layer discussed above. One end of this resistance is connected to the bit line 12. The other end of the resistance is connected to a conduction terminal of an access transistor 18. The access transistor 18 in the illustrated element 10 is an n-channel FET with its source conduction terminal connected to ground and its drain conduction terminal connected to the other end of the resistance. The gate terminal of the access transistor 18 is connected to the word line 14.

A write digit line 20 (WDL) and a write bit line 22 (WBL) for the element 10 intersect at the magnetic tunnel junction 14. These lines 20 and 22 selectively carry currents and thus each selectively create a magnetic flux proximate to the magnetic tunnel junction 16. The magnetic fields induced by current flow in the lines 20 and 22 can be used to set the non-fixed direction of the magnetic vector within the magnetic tunnel junction 16. As discussed above, the setting of this direction affects the resistance of the magnetic tunnel junction 16. By selectively applying current flow in the lines 20 and 22 at certain magnitudes, one can program the magnetic tunnel junction 16, through its varying resistance, to store a logic "1" or a logic "0."

In order to read the stored information from the element 10, the bit line 12 and word line 14 are selected. Selection of the word line 14 turns on the access transistor 18 and grounds the second end of the magnetic tunnel junction 16 resistance. A current, having a magnitude dependent on the programmed non-fixed direction of the magnetic vector within the magnetic tunnel junction, will accordingly flow from the bit line 12 through the resistance. A sense amplifier (not shown) which is connected to the bit line 12 can then measure current flowing in the bit line 12, as affected by the current flowing through the magnetic tunnel junction 16 variable resistance, and "read" the logic state of the element 10.

A number of drawbacks are known to exist with this conventional MRAM element 10 structure and operation. With low supply voltages, the magnitude of the currents being measured are quite small. Thus, the sense amplifier used during the read operation will be slow and will occupy a large silicon area. A faster and more efficient MRAM element architecture is accordingly desired.

SUMMARY OF THE INVENTION

In accordance with one embodiment of the present invention, a magnetic random access memory element comprises a first and second magnetic tunnel junctions along with a latching circuit. A false node of the latching circuit is connected to the first magnetic tunnel junction while a true node of the latching circuit is connected to the second magnetic tunnel junction. The element further includes a pair of complementary bit lines, with a first access transistor inter-connecting a false one of the bit lines to the false node of the latching circuit, and a second access transistor inter-connecting a true one of the bit lines to the true node of the latching circuit.

In accordance with another embodiment of the present invention, a magnetic random access memory element comprises a first magnetic tunnel junction storing a first logic level value and a second magnetic tunnel junction storing a second, complementary logic level value. A write bit line and a write data line are associated with each of the first and second magnetic tunnel junctions and are configured to write the first logic level value in the first magnetic tunnel junction and the second, complementary, logic level value in the second magnetic tunnel junction.

In accordance with yet another embodiment of the present invention, an SRAM memory cell has a four transistor (4T) two load (2R) architecture wherein the two loads comprise resistances associated with a pair of magnetic tunnel junctions.

Other aspects of the present invention include memory arrays made up of a plurality of memory elements according to any one of the embodiments described above. These memory arrays are implemented as integrated circuits fabricated on a semiconductor substrate.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 is a schematic diagram of a prior art magnetic random access memory (MRAM) element;

FIG. 2 is a schematic diagram of a magnetic random access memory element according to an embodiment of the present invention; and FIG. 3 is a block diagram of a memory array utilizing the MRAM elements of FIG. 2.

DETAILED DESCRIPTION OF THE DRAWINGS

Reference is now made to FIG. 2 wherein there is shown a schematic diagram of a magnetic random access memory (MRAM) element 100 according to an embodiment of the present invention. Each element 100 includes first and second magnetic tunnel junctions 102 and 104 which are each represented in the schematic by a variable resistance and wherein each is physically composed of the first and second magnetic layers and the separating non-magnetic layer as discussed above. One end of each resistance is connected to a first voltage reference 106 (preferably, a positive voltage Vdd). The other end of each resistance is connected at nodes F and T to a conduction terminal of a separate latch transistor 108 and 110, respectively. The latch transistors 108 and 110 are cross-coupled to form a latching circuit such that the gate of the first latch transistor 108 is connected to the conduction terminal of the second latch transistor 110 (and also to the other end of the resistance for the second magnetic tunnel junction 104 at node T). Conversely, the gate of the second latch transistor 110 is connected to the conduction terminal of the first latch transistor 108 (and also to the other end of the resistance for the first magnetic tunnel junction 102 at node F). The other conduction terminals for the latch transistors 108 and 110 are connected to a second voltage reference (preferably, a ground reference). Each of the latch transistors 108 and 110 in the illustrated element 100 is an n-channel FET with its source conduction terminal connected to ground and its drain conduction terminal connected to the other end of one of the two magnetic tunnel junction resistances at nodes F and T, respectively. The gate terminal of each latch transistor 108 and 110 forms the cross-coupling connection to nodes F and T as shown.

The element 100 further includes two, complementary, bit lines, one a false bit line (BLF) 112$f$ and the other a true bit line (BLT) 112$t$. The two bit lines are connected to the latching circuit transistor structure of the element 100 at nodes F and T through a pair of access transistors 114 and 116. The first access transistor 114 inter-connects the false bit line 112$f$ with the first latch transistor 108 and first magnetic tunnel junction 102 resistance at node F. Similarly, the second access transistor 116 inter-connects the true bit line 112$t$ with the second latch transistor 110 and second magnetic tunnel junction 104 resistance at node T. The gate terminals of the two access transistors 114 and 116 are both connected to the word line (WL) 118 of the element 100.

A write digit line 120 (WDL) and a write bit line 122 (WBL) is provided for each of the two included magnetic tunnel junctions 102 and 104. The two write digit lines 120 are connected in series and provide common direction current flow with respect to the two magnetic tunnel junctions 102 and 104. The two write bit lines 122 are also connected in series, but instead are provided in one embodiment with inverse direction current flow with respect to the two magnetic tunnel junctions 102 and 104. This inverse direction of current flow through the two magnetic tunnel junctions 102 and 104 provides for a complementary writing of data to the two magnetic tunnel junctions 102 and 104. In other words, by having a current flow one way through the write bit line of the first magnetic tunnel junction 102 and having the same current flow the other way through the write bit line of the second magnetic tunnel junction 104, the non-fixed directions of the magnetic vectors will be different (i.e., opposite) in each junction and the associated variable resistances in each junction will be different. Thus, each magnetic field junction (and accordingly each side of the latch structure) will store one of two complementary logic values that are made available by the cross-coupled latch transistors at the nodes T and F.

It will additionally be recognized that the two write bit lines 122 could in an alternative embodiment be separately controlled (i.e., not connected in series). A current or no current could then be selectively applied as to each of the write bit lines 122 for a toggle write of the cell 100 through the false and true magnetic tunnel junctions 102 and 104, respectively.

It will be recognized by those skilled in the art that the MRAM element 100 as illustrated in FIG. 2 has an architectural structure analogous to a conventional four transistor two resistor (or load) (4T-2R) static random access memory (SRAM) cell. Its operation is analogous as well. If, when the first reference voltage is applied, the resistance of the first magnetic tunnel junction 102 is low and the resistance of the second magnetic tunnel junction 104 is high, the MRAM element 100 is initialized into the logic "0" state and the appropriate complementary logic signals are provided at nodes T and F. Conversely, if, when the first reference voltage is applied, the resistance of the first magnetic tunnel junction 102 is high and the resistance of the second magnetic tunnel junction 104 is low, the MRAM element 100 is initialized into the logic "1" state and the appropriate complementary logic signals are provided at nodes T and F. In other words, the logic state of the element 100, as specified by the resistances of the two magnetic tunnel junctions, is locked by the latching functionality of the two cross-coupled latch transistors 108 and 100 and provided at the nodes T and F.

The setting of the resistances in the magnetic tunnel junctions (i.e., the writing of data to the element 100) is accomplished by applying the appropriate currents to the series connected write digit lines 120 and write bit lines 122. This operation is well understood by those skilled in the art.

Reading of the element 100 is accomplished in the same manner as with the conventional 4T-2R cell of the prior art by selecting the word line and activating the sense amplifier for the pair of complementary bit lines associated with the selected element 100. Likewise, this operation is well understood by those skilled in the art.

The MRAM element 100 of the present invention can be read much more quickly than the prior art MRAM element 10 illustrated in FIG. 1 (in fact, with a speed approaching or substantially equivalent to that of conventional SRAM cells). Additionally, the MRAM element 100 of the present invention utilizes a silicon area which, although larger than that of the prior art MRAM element 10, is nonetheless smaller than the area required for a conventional 4T-2R (or 6T) SRAM cell. The MRAM element 100 can not only be read more quickly, but it also can make use of smaller and less sensitive sense amplifiers than the prior art element 10.

The schematic structure illustrated in FIG. 2 can be used as one element 100 (or cell) in a large memory array. This array, as shown in FIG. 3, contains N×M MRAM elements 100 in a memory block 200. A collection of sense amplifiers 202 are connected to the complementary pairs of bit lines for purpose of reading certain ones of the elements 100 as are chosen by word line selection. Row and column decode circuitry 204 and 206 is used for making selection to groups of elements 100. Write control circuitry 208 (which includes input circuitry) is provided to apply the proper currents to the write bits lines and write data lines within the memory block 200 for purposes of writing logic data to selected elements 100. Output circuitry 210 is connected to the sense amplifiers 202 for outputting the read logic data from the elements 100. The entire memory circuit 212 is preferably integrated on a single semiconductor substrate. Alternatively, if desired, only certain portions of the memory circuit 212 may be integrated on a single semiconductor substrate.

With respect to fabrication, it is possible to stack the two magnetic tunnel junctions on top of the four transistor (4T) structure and thus save considerable space.

The terms "connected" or "coupled" as used herein do not necessarily require a direct connection among and between the recited components. Rather, it will be appreciated by those skilled in the art that the Figures are illustrative and indirect connections or couplings through other components or devices or layers is possible without detracting from the operation of the invention.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A magnetic random access memory element, comprising:
    a first variable magnetic tunnel junction resistance having a first and a second node, the first node of the first resistance connected to a reference voltage supply;
    a second variable magnetic tunnel junction resistance having a first and second node, the first node of the second resistance connected to the reference voltage supply;
    a latching circuit including a false node connected to the second node of the first variable magnetic tunnel junction resistance and a true node connected to the second node of the second variable magnetic tunnel junction resistance;
    a write bit line and a write data line associated with each of the first and second magnetic tunnel junction resistances;
    wherein the write data lines are connected in series to carry current past the first and second magnetic tunnel junction resistances in a same direction; and
    wherein the write bit lines are connected in series to carry current past the first and second magnetic tunnel junction resistances in opposite directions.

2. The element of claim 1 further comprising:
    a pair of complementary bit lines;
    a first access transistor inter-connecting a false one of the bit lines to the false node of the latching circuit; and
    a second access transistor inter-connecting a true one of the bit lines to the true node of the latching circuit.

3. The element of claim 2 further comprising a word line connected to a gate terminal of each of the first and second access transistors.

4. A magnetic random access memory element, comprising:
    a first magnetic tunnel junction storing a first logic level value;
    a second magnetic tunnel junction storing a second, complementary logic level value;
    a pair of data bit lines for the element, one for each magnetic tunnel junction, and a data word line for the element;
    a write bit line, separate from the data bit lines, and a write data line, separate from the data word line, associated with each of the first and second magnetic tunnel junctions and configured to write the first logic level value in the first magnetic tunnel junction and the second, complementary, logic level value in the second magnetic tunnel junction; and
    wherein the write bit lines are connected in series to carry current past the first and second maanetic tunnel junctions in opposite directions.

5. The element of claim 4 wherein the write data lines are connected in series to carry current past the first and second magnetic tunnel junctions in a same direction.

6. The element of claim 4 further including a latching circuit including a false node connected to the first magnetic tunnel junction and a true node connected to the second magnetic tunnel junction.

7. The element of claim 6 wherein the latching circuit comprises a pair of cross-coupled latching transistors.

8. The element of claim 4 further comprising:
    a pair of complementary bit lines;
    a first access transistor inter-connecting a false one of the bit lines to the false node of the latching circuit; and
    a second access transistor inter-connecting a true one of the bit lines to the true node of the latching circuit.

9. The element of claim 8 further comprising a word line connected to a gate terminal of each of the first and second access transistors.

10. An SRAM memory cell having a four transistor (4T) two load (2R) architecture wherein the two loads comprise variable resistances associated with a pair of magnetic tunnel junctions and further comprising a write bit line and a write data line associated with each of the magnetic tunnel junctions, the write bit lines being connected in series to carry current past individual ones in the pair of magnetic tunnel junctions in opposite directions.

11. The cell of claim 10 wherein the write bit lines and write data lines are configured to write a first logic level value in a first one of the magnetic tunnel junctions and a second, complementary, logic level value in a second one of the magnetic tunnel junctions.

12. The cell of claim 10 wherein the four transistors comprise:
    a first and second cross-coupled latch transistors; and
    a first and second bit line access transistors.

13. The cell of claim 12 wherein the four transistors comprise n-channel transistors.

14. The cell of claim 10, wherein the write data lines are connected in series to carry current past the pair of magnetic tunnel junctions in a same direction.

15. A memory device, comprising:
    a memory array including a plurality of memory elements, wherein each element is an SRAM memory cell having a four transistor (4T) two load (2R) architecture where the two loads comprise variable resistances associated with a pair of magnetic tunnel junctions and each element further comprises a write bit line and a write data line associated with each of the magnetic tunnel junctions, the write bit lines being connected in series to carry current past individual ones in the pair of magnetic tunnel junctions in opposite directions.

16. The memory device of claim 15 wherein each memory element is associated with a complementary pair of bit lines.

17. The memory device of claim 16 further including a sense amplifier connected to each of the complementary pairs of bit lines.

18. The memory device of claim 15 wherein the memory array is fabricated on a semiconductor substrate.

19. A memory device, comprising:
    a memory array including a plurality of memory elements, wherein each element comprises:
        a first magnetic tunnel junction storing a first logic level value;

a second magnetic tunnel junction storing a second, complementary logic level value;

a pair of data bit lines for the element, one for each magnetic tunnel junction, and a data word line for the element;

a write bit line, separate from the data bit lines, and a write data line, separate from the data word line, associated with each of the first and second magnetic tunnel junctions and configured to write the first logic level value in the first magnetic tunnel junction and the second, complementary, logic level value in the second magnetic tunnel junction; and wherein the write bit lines are connected in series to carry current past the first and second magnetic tunnel junctions in opposite directions.

20. The memory device of claim 19 wherein each memory element is associated with a complementary pair of bit lines.

21. The memory device of claim 20 further including a sense amplifier connected to each of the complementary pairs of bit lines.

22. The memory device of claim 19 wherein the memory array is fabricated on a semiconductor substrate.

23. A memory device, comprising:

a memory array including a plurality of memory elements, wherein each element comprises:

a first variable magnetic tunnel junction resistance having a first and a second node, the first node of the first resistance connected to a reference voltage supply;

a second variable magnetic tunnel junction resistance having a first and second node, the first node of the second resistance connected to the reference voltage supply;

a latching circuit including a false node connected to the second node of the first variable magnetic tunnel junction resistance and a true node connected to the second node of the second variable magnetic tunnel junction resistance;

a write bit line and a write data line associated with each of the first and second magnetic tunnel junction resistances;

wherein the write data lines are connected in series to carry current past the first and second magnetic tunnel junction resistances in a same direction; and wherein the write bit lines are connected in series to carry current past the first and second magnetic tunnel junction resistances in opposite directions.

24. The memory device of claim 23 wherein each memory element is associated with a complementary pair of bit lines.

25. The memory device of claim 24 further including a sense amplifier connected to each of the complementary pairs of bit lines.

26. The memory device of claim 23 wherein the memory array is fabricated on a semiconductor substrate.

* * * * *

UNITED STATES PATENT AND TRADEMARK OFFICE
CERTIFICATE OF CORRECTION

PATENT NO. : 7,079,415 B2 Page 1 of 1
APPLICATION NO. : 10/881747
DATED : July 18, 2006
INVENTOR(S) : Christophe Frey It is certified that error appears in the above-identified patent and that said Letters Patent is hereby corrected as shown below:

Column 6, line 2,   Replace "maanetic"
Claim 4             With --magnetic--

Signed and Sealed this

Twenty-first Day of November, 2006

JON W. DUDAS
*Director of the United States Patent and Trademark Office*